(12) United States Patent
Song

(10) Patent No.: US 6,618,607 B2
(45) Date of Patent: Sep. 9, 2003

(54) MRI IMAGING METHODS USING A SINGLE EXCITATION

(75) Inventor: Allen W. Song, Chapel Hill, NC (US)

(73) Assignee: Duke University, Durham, NC (US)

( * ) Notice: Subject to any disclaimer, the term of this patent is extended or adjusted under 35 U.S.C. 154(b) by 0 days.

(21) Appl. No.: 09/978,514

(22) Filed: Oct. 15, 2001

(65) Prior Publication Data

US 2002/0082497 A1 Jun. 27, 2002

Related U.S. Application Data

(60) Provisional application No. 60/241,999, filed on Oct. 20, 2000.

(51) Int. Cl.⁷ ................................................. A61B 5/05

(52) U.S. Cl. ..................... 600/410; 324/312; 324/316; 324/319; 382/128; 382/131

(58) Field of Search ................................. 600/407, 410; 324/312, 316, 300, 309; 382/128, 131

(56) References Cited

U.S. PATENT DOCUMENTS

| | | | | |
|---|---|---|---|---|
| 4,767,991 A | | 8/1988 | Rzedzian | 324/312 |
| 5,917,323 A | * | 6/1999 | Du et al. | 324/309 |
| 6,242,916 B1 | * | 6/2001 | King | 324/309 |
| 6,307,368 B1 | * | 10/2001 | Vasanawala et al. | 324/309 |

OTHER PUBLICATIONS

Bandettini et al. "Time Course EPI of Human Brain Function during Task Activities," *Magnetic Resonance in Medicine*. (1992) vol. 25, pp. 390–397.
Belliveau et al. "Functional Mapping of the Human Visual Cortex by Magnetic Resonance Imaging," *Science*. vol. 254, Nov. 1, 1991, pp. 716–718.
Chen et al. "Removal of Intravoxel Dephasing Artifact in Gradient–Echo Images Using a Field–Map Based RF Refocusing Technique," *Magnetic Resonance in Medicine*. (1999) vol. 42, pp. 807–812.
Cho et al. "Reduction of Susceptibility Artifact in Gradient–Echo Imaging," *Magnetic Resonance in Medicine*. (1992) vol. 23, pp. 193–200.
Constable et al. "Composite Image Formation in z–Shimmed Functional MR Imaging," *Magnetic Resonance in Medicine*. (1999) vol. 42, pp. 110–117.
Constable, R.T. "Functional MR imaging using gradient–echo echo–planar imaging in the presence of large static filed inhomogeneities," *J. Magn.Reson. Im*. (1995) vol. 5, pp. 746–752.
Frahm et al. "Direct FLASH MR Imaging of Magnetic Field Inhomogeneities by Gradient Compensation," *Magnetic Resonance in Medicine*. (1988) vol. 6, pp. 474–480.
Glover et al. "Reduction of susceptibility effects in BOLD fMRI using tailored RF pulses," *Proc. ISMRM*. (1998) p. 298.

(List continued on next page.)

*Primary Examiner*—Marvin M. Lateef
*Assistant Examiner*—Jeoyuh Lin
(74) *Attorney, Agent, or Firm*—Myers Bigel Sibley & Sajovec, P.A.

(57) ABSTRACT

Signal recovery in functional magnetic resonance imaging (fMRI) is provided by generating a single excitation pulse and exciting a target region of a subject with the generated excitation pulse. A first image is obtained using a first partial k-space frame of the target region. A compensation pulse is generated and the target region excited with the compensation pulse. A second, compensated, image is obtained subsequent to the excitation by the compensation pulse using a second partial k-space frame of the target region. The first and second images are combined to form a combined image of the target region. The first and second obtaining steps are carried out sequentially during a single quadratic excitation pulse.

39 Claims, 6 Drawing Sheets

OTHER PUBLICATIONS

Jezzard et al. "Correction for Geometric Distortion in Echo Planar Images from $B_0$ Field Variations," *Laboratory of Cardiac Energetics, NHLBI, National Institutes of Health.* (1995) pp. 65–73.

Kwong et al. "Dynamic magnetic resonance imaging of human brain activity during primary sensory stimulation," *Proc. Natl Acad. Sci USA.* vol. 89, Jun. 1992, pp. 5675–5679.

MacFall et al. "Correction of Spatially Dependent Phase Shifts for Partial Fourier Imaging," *Magnetic Resonance Imaging.* (1988) vol. 6, pp. 143–155.

Menon et al. "Tesla Gradient Recalled Echo Characteristics of Photic Stimulation–Induced Signal Changes in the Human Primary Visual Cortex," *Center of Magnetic Resonance Research (CMRR), University of Minnesota Medical School.* (1993) pp. 380–386.

Ogawa et al. "Functional brain mapping by blood oxygenztion level–dependent contrast magnetic resonance imaging: A comparison of signal characteristics with a biophysical model," *J. Biophysical Society.* vol. 64, Mar. 1993, 803–12.

Ogawa et al. "Instrinsic signal changes accompanying sensory stimulation: Functional brain mapping with magnetic resonance imaging." *Proc. Natl Acad. Sci USA.* vol. 89, Jul. 1992, pp. 5951–5955.

Ordidge et al. "Assessment of Relatie Brain Iron Concentraions Using $T_2$–Weighted and $T_2^*$–Weighted MRI at 3 Telsa," *Dept. of Neurology, Henry Ford Hospital & Health Sciences Center, Detroit, Michigan.* (1994) pp. 335–341.

Stenger et al. "Gradient compensation method for the reduction of susceptibility artifacts for spiral fMRI data acquisition," *Proc. ISMRM.* (1999) p. 538.

Weisskoff et al. "Correcting gross distortions on echo–planar images," *Proc. SMRM.* (1992) p. 4515.

Wong et al. "Shim–insensitive phase correction for EPI using a two–echo reference scan," *Proc. SMRM.* (1992), p. 4514.

Yang et al. "Multi–Gradient Echo with Susceptibility Inhomogeneity Compensation (MGESIC): Demonstration of fMRI in the Olfactory Cortex at 3.0 T," *Depts. of Radiology (Center for NMR Research) and Neurology and Behavioral Science, Pennsylvania State University, College of Medicine.* (1997) pp. 331–335.

Young et al. "The Benefits of Increasing Spatial Resolution as a Means of Reducing Artifacts due to Field Inhomogeneities," *Magnetic Resonance Imaging.* (1988) vol. 6, pp. 585–590.

Jesmanowicz et al. "Single–Shot Half k–Space High–Resolution Gradient–Recalled EPI for fMRI at 3 Tesla," *Biophysics Research Institute, Medical College of Wisconsin.* (1998) pp. 754–762.

Mao et al. Intravoxel rephasing of spins dephased by susceptibility effect for EPI sequences, *ISMRM*, (1999) p. 1982.

Song, A.W. "Single–shot EPI with signal recovery from the susceptibility–induced losses," *Magnetic Resonance in Medicine.* vol. 46, No. 2, Aug., 2001, pp. 407–411.

Wiggins et al. "Dual–Echo EPI: an fMRI method for regions of varying BO homogeneity," *Proc. SMRM, Sixth Scientific Meeting and Exhibition, Sydney Australia.* vol. 2, Apr. 18–24, 1998, p. 1449.

International Search Report, PCT/US 01/32277, Mar. 27, 2002, 6 pages.

* cited by examiner

MRI IMAGING METHODS USING A SINGLE EXCITATION

CLAIM OF PRIORITY

The present application claims priority from U.S. Provisional Patent Application Serial No. 60/241,999 filed Oct. 20, 2000, the disclosure of which is incorporated by reference herein as if set forth fully herein

FIELD OF THE INVENTION

The present invention is related to functional magnetic resonance imaging (fMRI) methods.

BACKGROUND OF THE INVENTION

Functional magnetic resonance imaging (fMRI) has been used widely in brain imaging studies for the past several years. See e.g., J. W. Belliveau, D. N. Kennedy, R. C. McKinstry, B. R. Buchbinder, R. M. Weisskoff, M. S. Cohen, J. M. Vevea, T. J. Brady and B. R. Rosen, "Functional mapping of the human visual cortex by magnetic resonance imaging," Science 254, 716–719, 1991; K. K. Kwong, J. W. Belliveau, D. A. Chesler, I. E. Goldberg, R. M. Weisskoff, B. P. Poncelet, D. N. Kennedy, B. E. Hoppel, M. S. Cohen, R. Turner, H.-M. Cheng, T. J. Brady and B. R. Rosen, "Dynamic magnetic resonance imaging of human brain activity during primary sensory stimulation," Proc. Natl. Acad. Sci. USA 89, 5675–5679, 1992; P. A. Bandettini, E. C. Wong, R. S. Hinks, R. S. Tikofsky, and J. S. Hyde, "Time course EPI of human brain function during task activation," Magn. Reson. Med. 25, 390–397, 1992; S. Ogawa, D. W. Tank, R. Menon, J. M. Ellerman, S.-G. Kim, H. Merkle, and K. Ugurbil, "Intrinsic signal changes accompanying sensory stimulation: functional brain mapping with magnetic resonance imaging," Proc. Natl. Acad. Sci. USA 89, 5951–5955, 1992; and R. Menon, S. Ogawa, D. W. Tank, and K. Ugurbil, "4 Tesla gradient recalled echo charateristics of photic stimulation-induced signal changes in the human primary visual cortex," Magn. Reson. Med. 30, 380–386, 1993. One of the most often used methods is the gradient-recalled echo-planar imaging (EPI) technique because of its good sensitivity to the blood oxygenation level dependent signal and high speed. See S. Ogawa, R. S. Menon, D. W. Tank, S.-G. Kim, H. Merkle, J. M. Ellerman and K. Ugurbil, "Functional brain mapping by blood oxygenation level-dependent contrast magnetic resonance imaging," Biophys. J. 64, 803–812, 1993. However, its usage is limited in areas with severe static inhomogeneity induced by susceptibility effect near air/tissue interfaces.

One potential problem in gradient-recalled EPI using a long echo time is the severe signal losses at areas with large static inhomogeneities. These areas include the ventral frontal, medial temporal and inferior temporal regions that experience inhomogeneities induced by the susceptibility effects near air/tissue interfaces. For fMRI studies that use both the gradient-recalled EPI and high field scanners, these signal losses may prevent investigation of the human cognitive processes such as the memory and attention studies. Methods have been developed to recover the signal losses, however, these methods typically involved multiple excitations, thus, compromising the temporal resolution.

Susceptibility artifacts can be manifested primarily in two ways: signal losses and geometric distortions. In general, a long echo time makes an MRI system more prone to signal losses in the presence of an inhomogeneous field because of the intra-voxel dephasing, and a long readout time typically leads to geometric distortions due to the reduced sampling frequency and reduced readout gradient strength. Typically, pronounced susceptibility-related field variation along the slice-selective direction in combination with a long echo time results in severe signal losses, while the inhomogeneity in-plane combined with a long readout time leads to geometric distortions. Thus, signal losses can be caused by the susceptibility-induced gradient along the slice-selective direction. Because of the long echo time typically used in fMRI experiments to maximize the sensitivity toward the signal changes, the signal losses at areas near air/tissue interfaces may be severe. Refined methods to recover these signals may be needed in order to study brain function at these areas.

Several research groups have addressed these sorts of signal losses using various techniques. One such technique is to use a thinner slice thickness to reduce the field change across the slice. See I. R. Young, I. J. Cox, D. J. Bryant, and G. M. Bydder, "The benefits of increasing spatial resolution as a means of reducing artifacts due to field inhomogeneities," Magn. Reson. Imag. 6, 585–590, 1988. This technique may be relatively easy to implement but it may reduce SNR as well as the spatial coverage per unit time.

Frahm et al. originally proposed to use multiple refocusing gradients to effectively compensate the field inhomogeneities. J. Frahm, K. D. Merboldt, W. Hanicke, "Direct FLASH MR imaging of magnetic field inhomogeneities by gradient compensation," Magn. Reson. Med. 6, 474–480, 1988. This method was later adopted by several other groups and applied more recently in functional MRI. See e.g., R. J. Ordidge, J. M. Gorell, J. C. Deniau, R. A. Knight, J. A. Helpern, "Assessment of relative brain iron concentrations using T2-weighted and T2*-weighted MRI at 3 Tesla," Magn. Reson. Med. 32, 335–341, 1994; R. T. Constable, "Functional MR imaging using gradient-echo echo-planar imaging in the presence of large static field inhomogeneities," J Magn. Reson. Im. 5, 746–752, 1995; Q. X. Yang, B. J. Dardzinski, S. Li, P. J. Eslinger, M. B. Smith, "Multi-gradient echo with susceptibility compensation (MGESIC): demonstration of fMRI in the olfactory cortex at 3T," Magn. Reson. Med. 37, 331–335, 1997; R. T. Constable, D. D. Spencer, "Composite image formation in z-shimmed functional MR imaging," Magn. Reson. Med. 42, 110–117, 1999; and V. A. Stenger, F. E. Boada, and D. C. Noll, "Gradient compensation method for the reduction of susceptibility artifacts for spiral fMRI data acquisition," Proc. ISMRM, p. 538, 1999.

Because the superimposed gradient field across the slice is often not linear, one compensatory gradient is generally not sufficient to compensate the entire slice. Thus, a set of linear gradients is typically needed to compensate the non-linear field segment-by-segment to achieve satisfactory results. When the number of the linear gradients increase, i.e., increments become finer, the nonlinear field can be better compensated. Despite the effectiveness in recovering signal, the time-consuming nature of such techniques may limit their practical value in routine fMRI experiments. In practice, as many as sixteen repetitions may be needed to sum up to a uniform image. Most of cognitive fMRI experiments cannot be performed this way.

More sophisticated methods were also proposed that showed promise in reducing the number of compensating gradients to a much more tolerable level. The efficiency is much increased by using high-order field compensation. Cho et al. proposed tailored pulse with a quadratic profile that has shown improved tolerance toward field inhomogeneity. Z. H. Cho, and Y. M. Ro, "Reduction of susceptibility artifact in gradient-echo imaging," *Magn. Reson. Med.* 23, 193–196, 1992. Glover et al. also presented a method using high order phase compensation by obtaining a field profile for each subject and incorporating it into the phase profile of the excitation pulse. G. Glover, S. Lai, "Reduction of susceptibility effects in fMRI using tailored RF pulses," *Proc. ISMRM*, p.298, 1998. A similar concept was used in a recent report using a two-shot technique with explicitly matched RF excitation. N. K. Chen, A. M. Wyrwicz, "Removal of intravoxel dephasing artifact in gradient-echo images using a field-map based RF refocusing technique," *Magn. Reson. Med.* 42, 807–812, 1999. Another recent method used a two-shot technique combining a quadratic excitation pulse and the compensatory gradient. J. Mao, and A. W. Song, "Intravoxel rephasing of spins dephased by susceptibility effect for EPI sequences," *Proc. ISMRM*, p.1982, 1999. The resultant phase profile can be used to better match the susceptibility-induced gradients when an appropriate compensatory gradient is used. The two excitations can be implemented back-to-back within one run to allow fMRI experiments to be carried out; however, the effective repetition time is still doubled. Images from the two excitations can then be combined to achieve uniform spatial coverage across the inhomogeneous areas.

SUMMARY OF THE INVENTION

The present invention provides systems, methods and computer program products which provide fMRI signal recovery from a single excitation. Such methods, systems and computer program products may be particularly suitable and useful for fMRI studies and applications carried out in or about inhomogeneous areas with high temporal resolution.

In particular embodiments of the present invention, signal recovery in functional magnetic resonance imaging (fMRI) is provided by generating a single excitation pulse and exciting a target region of a subject with the generated excitation pulse. A first image is obtained using a first partial k-space frame of the target region. A compensation pulse is generated and the target region subjected to the compensation pulse. A second, compensated, image is obtained subsequent to the target region being subjected to the compensation pulse using a second partial k-space frame of the target region. The first and second images are combined to form a combined image of the target region. The first and second obtaining steps are carried out sequentially during a single quadratic excitation pulse.

In particular embodiments of the present invention, the single excitation pulse is a matched quadratic excitation pulse. Furthermore, the compensation pulse may be a z-shimming pulse.

In further embodiments of the present invention, the first partial k-space frame has an associated first sampling direction and the second partial k-space frame has an associated second sampling direction. Preferably, the first sampling direction and the second sampling direction are substantially the same direction.

In still additional embodiments of the present invention, the first partial k-space frame and the second partial k-space frame are sampled so that a center of each partial k-space frame is proximate. In such embodiment, the first image may be obtained by completely sampling a first half of the first partial k-space frame and partially sampling a second half of the first partial k-space frame. The second image is then obtained by partially sampling a first half of the second k-space frame and completely sampling a second half of the second k-space frame. Preferably, the sampling of the first half and the second half of the first k-space frame and the sampling of the first half and the second half of the second k-space frame are carried out in substantially the same direction.

In additional embodiments of the present invention, the Echo Time (i.e., the time difference between the excitation pulse and the center of k-space acquisition) (TE) associated with the first partial k-space frame and the TE associated with the second partial k-space frame are asymmetric with reference to the beginning of the respective partial k-space frames and are mirrored about a division between the first and second partial k-space frames.

In still further embodiments of the present invention, alignment indicia are inserted in the first and second images and the alignment indicia are aligned in each of the first and second images when the images are combined. In particular, the alignment indicia may be a centerline of the first k-space frame and a centerline of the second k-space frame.

In yet other embodiments of the present invention, a centerline of the first partial k-space frame is sampled in two sampling directions and a centerline of the second partial-k-space frame is also sampled in two sampling directions.

In additional embodiments of the present invention, the target region of a subject is an in vivo ventral frontal or inferior temporal area of the human brain. Furthermore, the combined image may provide information about the function of the human brain including human memory and attention processes in areas near air/tissue interfaces.

While embodiments of the present invention are described above with reference to methods, as will be appreciated by those of skill in the art, embodiments of the present invention may also be provided as systems and/or computer program products.

BRIEF DESCRIPTION OF THE DRAWINGS

FIG. 4A corresponds to images reconstructed from a first partial k-space and FIG. 4B corresponds to images reconstructed from the second partial k-space.

FIG. 5A illustrates images obtained using conventional single shot gradient recalled echo planar images. FIG. 5B illustrates images obtained using a two-shot acquisition with matched quadratic excitation and z-shim gradient. FIG. 5C illustrates images obtained using embodiments of the present invention utilizing a the single-shot acquisition with the same quadratic excitation and z-shim gradient.

DESCRIPTION OF EMBODIMENTS OF THE INVENTION

Figure 1:
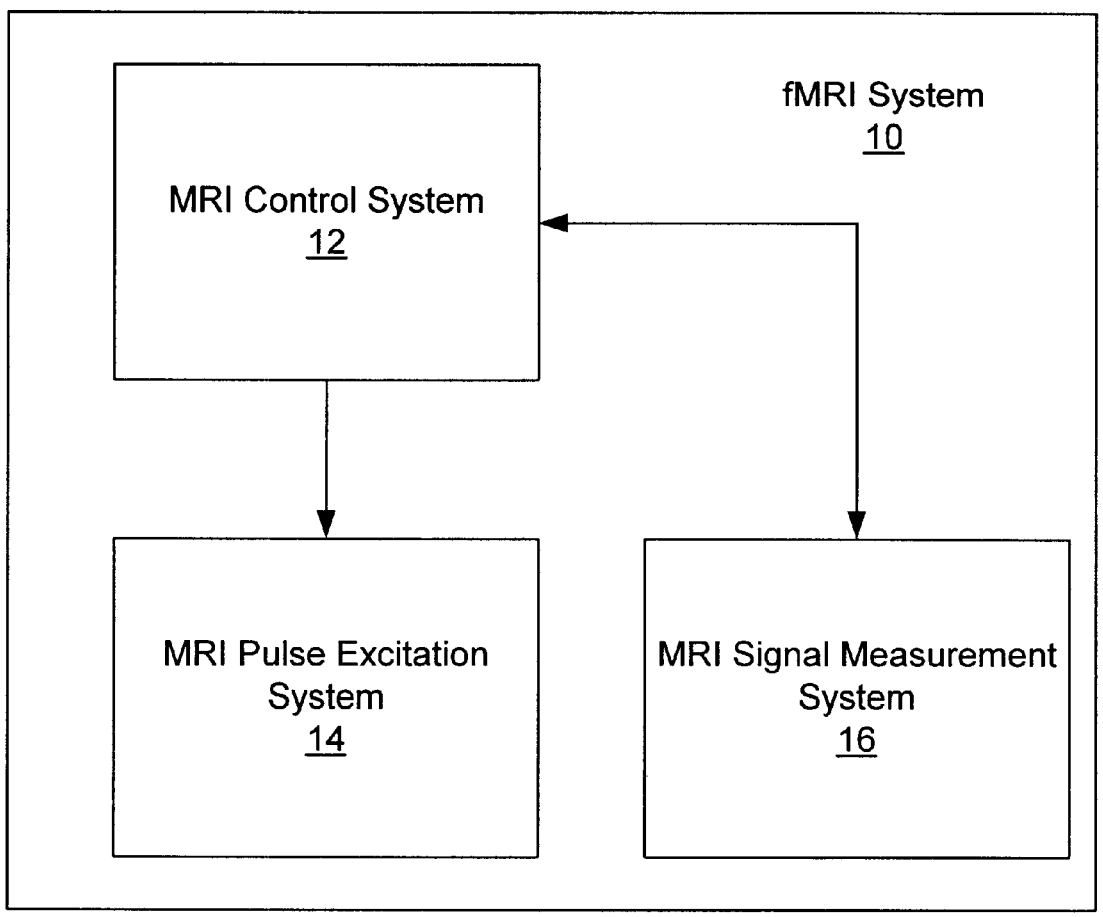
FIG. 1 is a block diagram of an fMRI system according to embodiments of the present invention.

The present invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

As will be appreciated by one of skill in the art, the present invention may be embodied as a method, system, or computer program product. Accordingly, the present invention may take the form of an entirely hardware embodiment, an entirely software embodiment or an embodiment combining software and hardware aspects all generally referred to herein as a "circuit" or "module." Furthermore, the present invention may take the form of a computer program product on a computer-usable storage medium having computer-usable program code embodied in the medium. Any suitable computer readable medium may be utilized including hard disks, CD-ROMs, optical storage devices, a transmission media such as those supporting the Internet or an intranet, or magnetic storage devices.

Computer program code for carrying out operations of the present invention may be written in an object oriented programming language such as Java®, Smalltalk or C++. However, the computer program code for carrying out operations of the present invention may also be written in conventional procedural programming languages, such as the "C" programming language. The program code may execute entirely on the user's computer, partly on the user's computer, as a stand-alone software package, partly on the user's computer and partly on a remote computer or entirely on the remote computer. In the latter scenario, the remote computer may be connected to the user's computer through a local area network (LAN) or a wide area network (WAN), or the connection may be made to an external computer (for example, through the Internet using an Internet Service Provider). Furthermore, the user's computer, the remote computer, or both, may be integrated into other systems, such as an MRI system.

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

Embodiments of the present invention provide for obtaining multiple acquisitions of MRI information from a single excitation pulse where a subsequent acquisition is compensated and the multiple acquisitions combined to provide an image. Although the conventional two-shot technique using matched quadratic excitation can be sufficient in achieving uniform images at inhomogeneous areas, the time penalty of such an approach may limit applications where both high temporal resolution (such as in event-related studies) and large spatial coverage are desired. Thus, embodiments of the present invention provide combining two acquisitions within one quadratic excitation which may improve the temporal resolution.

One approach to combining two acquisitions from a single excitation is to sequentially acquire k-space data twice within one excitation, with the second pass in k-space compensated with appropriate z-shim gradient. Two separate images can be reconstructed and combined to obtain a uniform spatial coverage. A drawback of this approach may be that a prolonged data acquisition window which may exceed the T2*value of the gray matter. Two unwanted features can result from this drawback: 1) the echo times of the two acquisition are much different causing severe mixing of the T2* contrast; and 2) the second acquisition may have very small signal intensity from the T2* decay, thus reducing the effectiveness of signal compensation.

As described in more detail below, embodiments of the present invention may overcome such potential limitations through the novel use of partial k-space acquisition. Partial k-space acquisition is described in U.S. Pat. No. 4,767,991 entitled "METHOD OF HIGH SPEED IMAGING WITH IMPROVED SPATIAL RESOLUTION USING PARTIAL K-SPACE ACQUISITIONS" which issued Aug. 30, 1988, the disclosure of which is incorporated herein by reference as if set forth fully herein. Partial k-space acquisition is also described in J. R. MacFall, N. J. Pelc, and R. M. Vavrek, "Correction of spatially dependent phase shifts for partial Fourier imaging," *Magn. Reson. Imaging.* 6, 143–155, 1988 and A. Jesmanowicz, P. A. Bandettini, J. S. Hyde, "Single-shot half k-space high-resolution gradient-recalled EPI for fMRI at 3 Tesla," *Magn. Reson. Med.* 40, 754–762, 1998.

A system incorporating embodiments of the present invention is illustrated in FIG. 1. As seen in FIG. 1, an fMRI system 10 includes an MRI control system circuit 12, an MRI pulse excitation system circuit 14 and an MRE signal measurement system circuit 16. The MRI control system circuit 12 controls operations of the fMRI system 10 as described herein. The MRI pulse excitation system circuit 14 and the MRI signal measurement system circuit 16 are controlled as described herein so as to provide a single excitation pulse and corresponding gradient and compensation pulses as well as provide for the partial k-space acquisition of the resulting MRI signals. Conventional MRI systems, such as those provided by General Electric Medical Systems, Siemens, Philips, Varian, Bruker, Marconi and Toshiba may be modified, by for example, programming such systems, to carry out the operations as described herein and, thereby, provide fMRI systems according to embodiments of the present invention.

While an exemplary fMRI system is illustrated in FIG. 1 and described herein with a particular division of functions and/or operations, as will be appreciated by those of skill in the art, other divisions of functions and/or operations may be utilized while still benefiting from the teachings of the present invention. For example, the MRI control system circuit 12 could be combined with either the MRI pulse excitation system circuit 14 or the MRI signal measurement system circuit 16. Thus, the present invention should not be construed as limited to a particular architecture or division of MRI functions/operations but is intended to cover any architecture or division of functions/operations capable of carrying out the operations described herein.

Figure 2A:
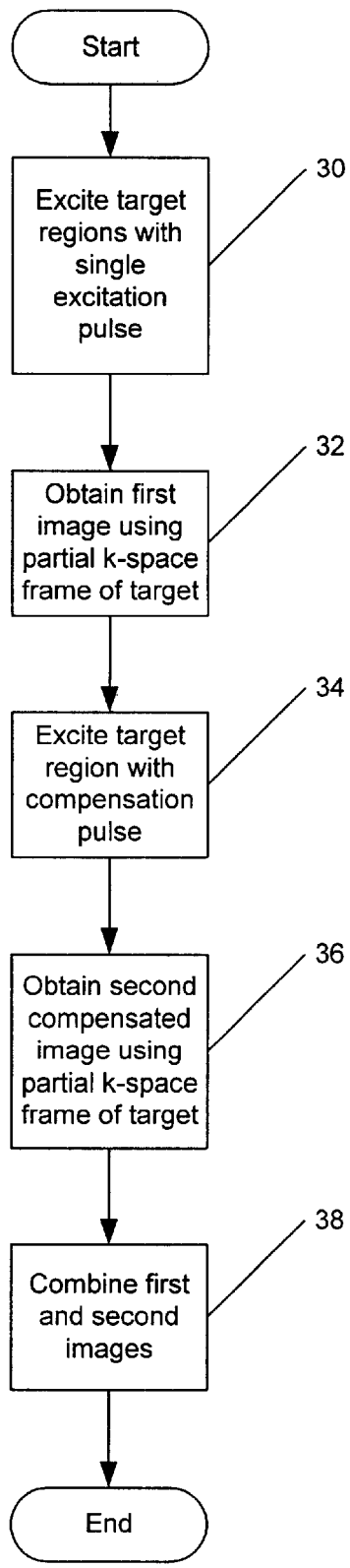
FIG. 2A is a flowchart illustrating operations according to embodiments of the present invention.

Operations according to embodiments of the present invention are illustrated in the flowchart of FIG. 2A, which will be described herein with reference to the exemplary fMRI system 10 of FIG. 1. As seen in FIG. 2A, the MRI control system circuit 12 causes the MRI pulse excitation system circuit 14 to excite a target region(s) of a subject with a single excitation pulse (block 30). The MRI control system circuit 12 also receives signal information from the MRI signal measurement system circuit 16 and obtains a first image using a partial k-space frame from of the target based on the received signal information (block 32). After obtaining the first image, the MRI control system circuit 12 causes the MRI pulse excitation system circuit 14 to subject the target region(s) to a compensation pulse (block 34). The MRI control system circuit 12 receives signal information from the MRI signal measurement system circuit 16 subsequent to the target region(s) being subjected to the compensation pulse and obtains a second, compensated, image using a partial k-space frame from of the target based on the received signal information (block 36). The two images are then combined to provide the fMRI image (block 38).

Figure 2B:
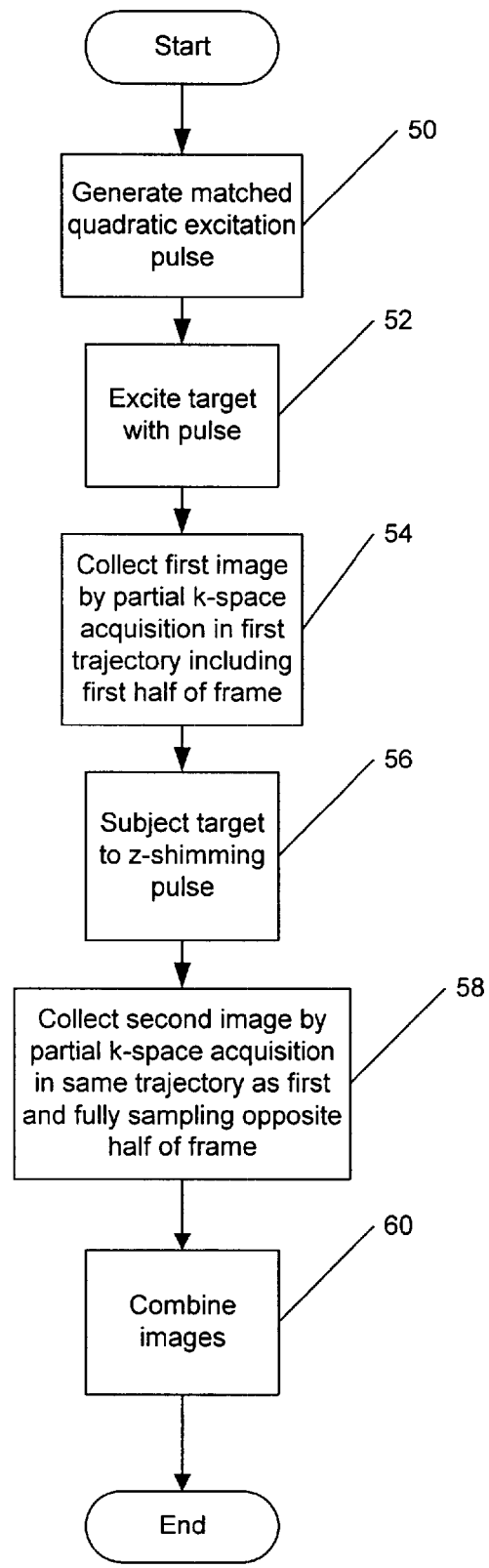
FIG. 2B is a flowchart illustrating operations according to further embodiments of the present invention.

FIG. 2B is a flowchart illustrating particular embodiments of the present invention. As seen in FIG. 2B, axial slice selection can be provided by generating a matched quadratic excitation pulse (block 50) and exciting the target region with the matched quadratic excitation pulse (block 52). After axial slice selection using the matched quadratic excitation pulse, the first image is collected using a partial k-space acquisition in a first trajectory (e.g. a first half k-space plus additional seven more lines) (block 54). The target is then subjected to a brief instance of z-shimming gradient (block 56). A second image is collected using a second partial k-space frame (e.g. a second half k-space plus additional seven more lines) (block 58). The k-space trajectory of the second k-space frame preferably has the same sampling direction to ensure the same characteristics of the phase propagation. Also, the center portions of the two partial k-space frames ($k_z$ frames) can, in certain embodiments, be kept substantially close together to reduce the T2* contrast mixing and also to provide sufficient signal level for the second acquisition. Finally, the first and second images are combined to provide the resultant image (block 60).

In certain embodiments of the present invention, an additional line can be positioned in the center (and/or at other desired locations) for both $k_z$ frames to serve as a reference to realign the even and odd lines in k-space and correct for the phase errors. Such a realignment and phase correction may be carried out as described in E. C. Wong, "Shim-insensitive phase correction for EPI using a two-echo reference scan," *Proc. SMRM*, p. 4514, 1992.

Figure 3A:
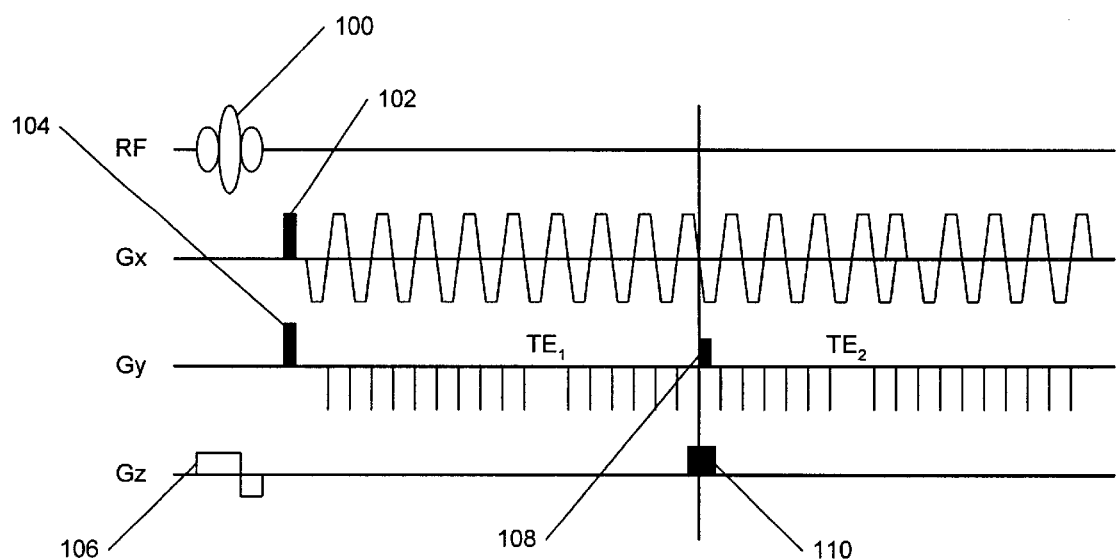
FIG. 3A is a schematic illustration of a single-shot EPI sequence according to embodiments of the present invention.
Figure 3B:
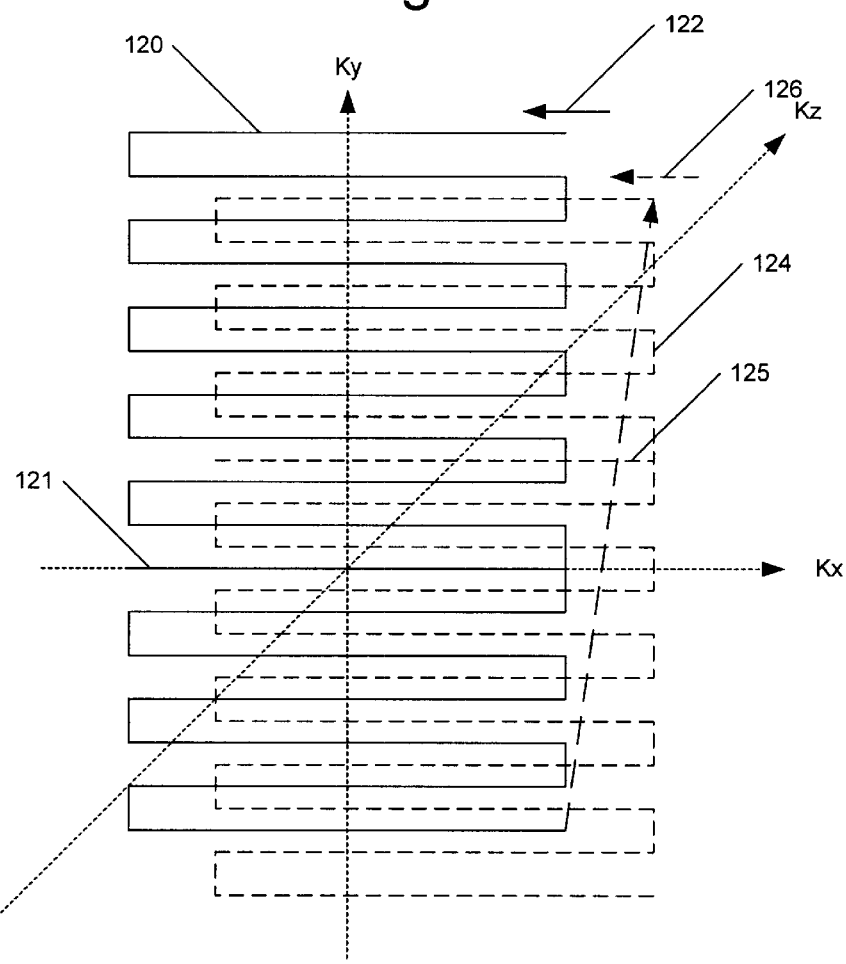
FIG. 3B is a schematic illustration of a resultant k-space trajectory using the sequence shown in FIG. 3A according to embodiments of the present invention.

A schematic illustration of a pulse sequence according to embodiments of the present invention is shown in FIG. 3A; the resultant k-space trajectory is shown in FIG. 3B. As is seen in FIG. 3A, the target area of a subject is subjected to a single matched quadratic excitation pulse 100. A slice is selected with the gradient Gz pulse 106 and a Gx gradient pulse 102 and a Gy gradient pulse 104 are also provided to as to establish the initial starting location of the initial partial k-space acquisition. The two $k_z$ frames are offset by $\Delta k_z$ which is determined by the z-shimming gradient 110 and the initial starting location for the second partial k-space acquisition is established by the Gy gradient pulse 108. The resulting trajectory is seen in FIG. 3B.

As is seen in FIG. 3A, as a result of the sampling of the first and second partial k-space frames, the centers of the k-space frames are corresponding close to the end of the sampling of the first partial k-space frame and close to the beginning of the sampling of the second partial k-space frame. As a result, Echo Time 1, the time difference between the excitation pulse and the center of the first partial k-space, ($TE_1$) for the first partial k-space frame and Echo Time 2, the time difference between the excitation pulse and the center of the second partial k-space) ($TE_2$) for the second partial k-space frame are relatively close together. Thus, according to embodiments of the present invention, it is preferred that $TE_1$ and $TE_2$ be asymmetric and mirrored about the division between the first and second partial k-space frames. Furthermore, it is preferred that $TE_1$ and $TE_2$ be close together to minimize signal decay from the first partial k-space acquisition to the second, preferably within about 10 ms.

In FIG. 3B, the first half of the first $k_z$ frame 120 (shown as a solid line) and the second half of the second $k_z$ frame 124 (shown as a dashed line) are completely sampled, while the second half of the first $k_z$ frame 120 and first half of the second $k_z$ frame 124 are partially sampled to help arrange the images such that the centers of the k-space of both $k_z$ planes remain proximate and close together. The first $k_z$ frame 120 has an initial trajectory in the direction shown by arrow 122. The second $k_z$ frame 124 preferably also has an initial trajectory in the same direction as the arrow 122 as is illustrated by the arrow 126. Thus, as described above, the first $k_z$ frame 120 and the second $k_z$ frame 124 may provide the same direction of sampling. Finally, the reference center lines are illustrated as lines 121 and 125 in FIG. 3B.

As will be appreciated by those of skill in the art in light of the present disclosure, partial k-space acquisition of a single excitation pulse may be provided through programming of an MRI system. Such programming may take many forms depending on the particular system utilized. However, set forth below is an example of a generalized program which provides a single excitation pulse and corresponding partial k-space acquisition according to particular embodiments of the present invention.

```
EXTERNAL_PULSE(rf1, magnitude_rf1, rf1_
    position, rf1_duration, slicethickness, flip_angle,
    pulse_cycle, number_of_points, quadratic_wave_
    magnitude);
EXTERNAL_PULSE(phase, phase_rf1, rf1_position,
    rf1_duration, slicethickness, flip_angle, pulse_cycle,
    number_of_points, quadratic_wave_phase);
TRAPEZOID(GRADIENT_Z, gz1_rephase, gz1_
    position, gz1_duration, gz1_amplitude);
TRAPEZOID(GRADIENT_X, gxep_dephase,
    dephase_position, dephase_duration, gxep_
    dephase_amplitude);
for (i=0; i<epyres; i++) {
    if (i%2==0) TRAPEZOID(GRADIENT_X, gxep_
        positive,
    start_position+i*cycle_length, gxep_duration, gxep_
        amplitude);
    else TRAPEZOID(GRADIENT_X, gxep_negative,
        start_position+i*cycle_length, gxep_duration,
        gxep_amplitude_negative);
```

```
}
TRAPEZOID(GRADIENT_Y, gyep_dephase,
    dephase_position, dephase_duration, gyep_
    dephase_amplitude);
for (i=0, j=0; i<epyres-3; i++, j++) {
    if (i<=36) {
    if (i==32) j+=1;
      TRIANGLE(GRADIENT_Y, gyep_blip, blip_
        position+j*cycle_length, blip_duration, blip_
        amplitude);
    if (i>37) {
    if (i==43) j+=1;
      TRIANGLE(GRADIENT_Y, gyep_blip, blip_
        position+j*cycle_length, blip_duration, blip_
        amplitude);
}
    TRAPEZOID(GRADIENT_Z, gzblip, position_
      gzblip, duration_gzblip, gzblip_amplitude);
    TRAPEZOID(GRADIENT_Y, gyblip, position_
      gyblip, duration_gyblip, gyblip_amplitude);
```

The above code has been generalized differing routines may be utilized depending on the particular MRI system utilized. However, in general, i the above code, EXTERNAL_PULSE is a routine that displays a sequence of binary numbers according to the arguments such as timing, magnitude and phase information of a given file, e.g., quadratic_wave_magnitude. TRAPEZOID is a routine that displays a trapezoid waveform according to the location, duration and amplitude given in the arguments. TRIANGLE is a routine that displays a triangle waveform according to the location, duration and amplitude given in the arguments. The above program is provided merely as an example. The present invention should not be construed as limited to such a program.

Embodiments of the present invention may provide an effective single-shot method that can recover susceptibility effect-induced signal losses. Compared with previous methods that used multiple excitations, embodiments of the present invention can achieve comparable signal recovery with much improved temporal resolution. This advantage can allow fMRI investigations to be carried out in statically inhomogeneous areas such as the ventral frontal and inferior temporal areas without compromising acquisition speed. In certain embodiments and applications, it is anticipated that this technique can be particular useful in event-related studies of the brain, including human memory and attention processes that involve areas near air/tissue interfaces. Examples of such processes may include the progression of Alzheimer's disease, stroke, age, attention deficit disorders, and the like. In addition the impact of pharmacological products on this region of the brain may be verified or studied (before and after, or during a treatment) to ascertain the impact of a course of treatment or a targeted drug.

Embodiments of the present invention will now be illustrated with reference to certain examples which are included herein for the purposes of illustration only, and which are not intended to be limiting of the invention.

EXAMPLES

Imaging Parameters

A pulse sequence according to embodiments of the present invention was developed and implemented on a GE 1.5 T whole-body scanner (General Electric Medical Systems, Milwaukee, Wis.). A complex excitation pulse with quadratic phase profile across the slice was used to better match the susceptibility-induced gradient. Raw data before Fourier Transform was collected using the aforementioned k-space trajectory. The slice thickness was 5 mm and FOV 24 cm. Both $k_z$ frames were acquired using a 64×39 matrix. The repetition time (TR) was 1 second. The joint point of the two frames occurred at 40 ms from the excitation, resulting in echo times (TE) of 36 ms and 44 ms for the two images, respectively. A receiver bandwidth of 125 kHz was used, the transition time from zero to readout amplitude for the readout gradient was 96 $\mu$s. Thus, the total acquisition time was 55 ms, comparable to a 45 ms acquisition window for a conventional single-shot gradient-recalled EPI of 64×64 matrix using the same slew rate. The z-shim gradient had a duration of 1.4 ms at the joint of the two $k_z$ frames. Its amplitude could be altered by a control variable in real time to ensure optimal compensation. With this setup, a maximum of 13 slices can be acquired per second, highly comparable to a conventional single-shot EPI scan of 14 slices per second.

Results

Figure 4A:
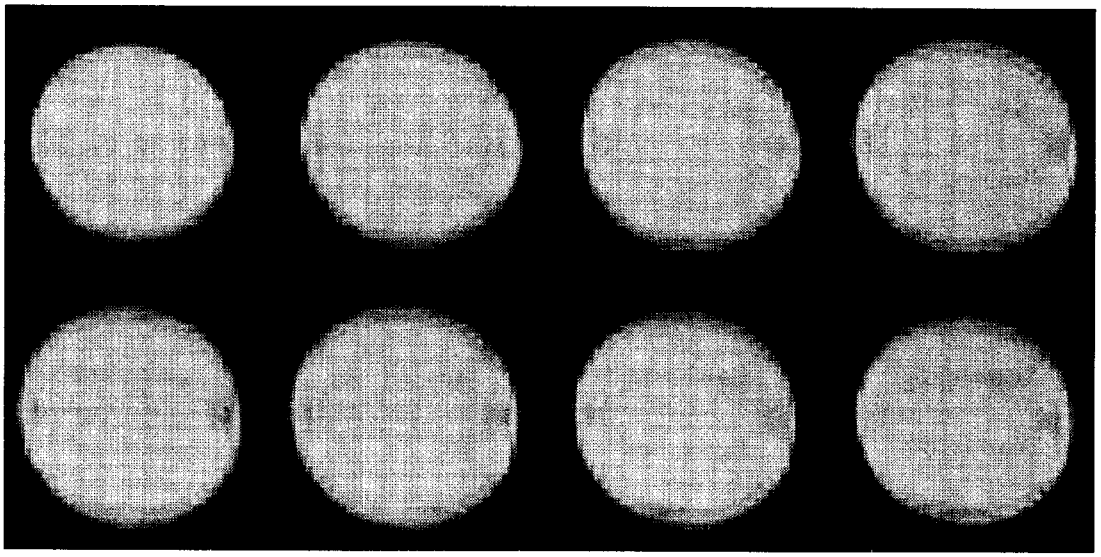
FIGS. 4A and 4B are screen images of single-shot axial echo-planar images of a water phantom obtained according to methods of the present invention.
Figure 4B:
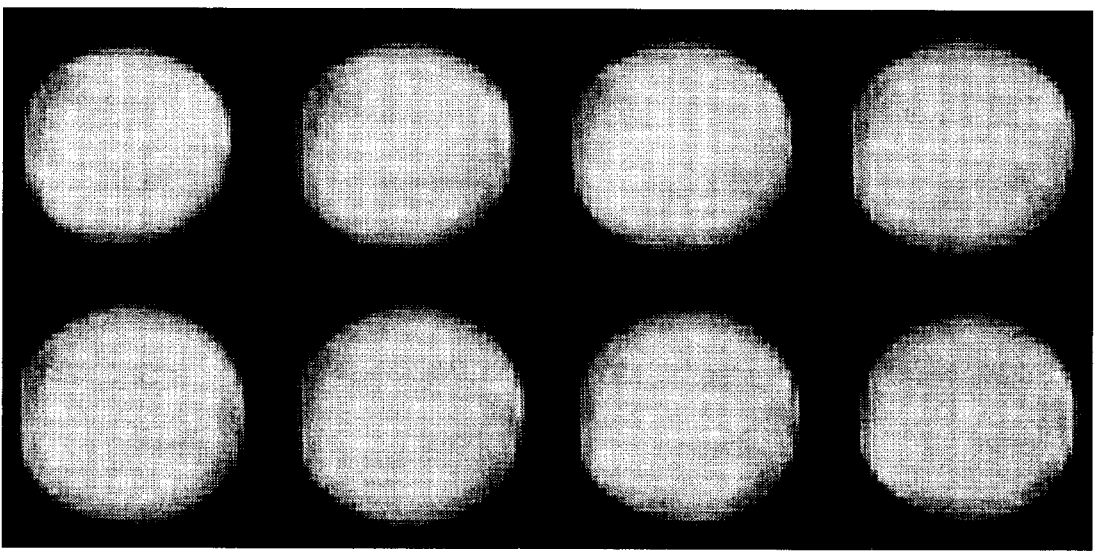
Figure 5A:
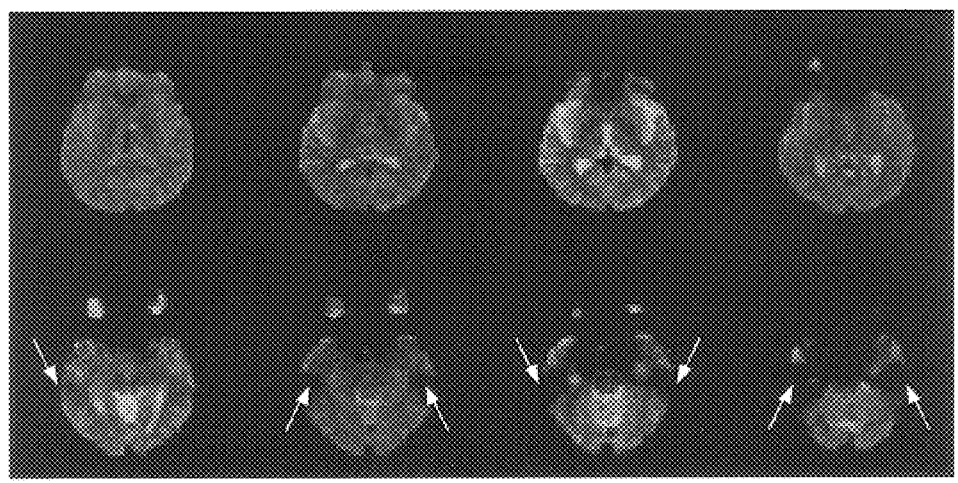
FIGS. 5A–5C are screen images of axial images of a human brain using EPI acquisitions.
Figure 5B:
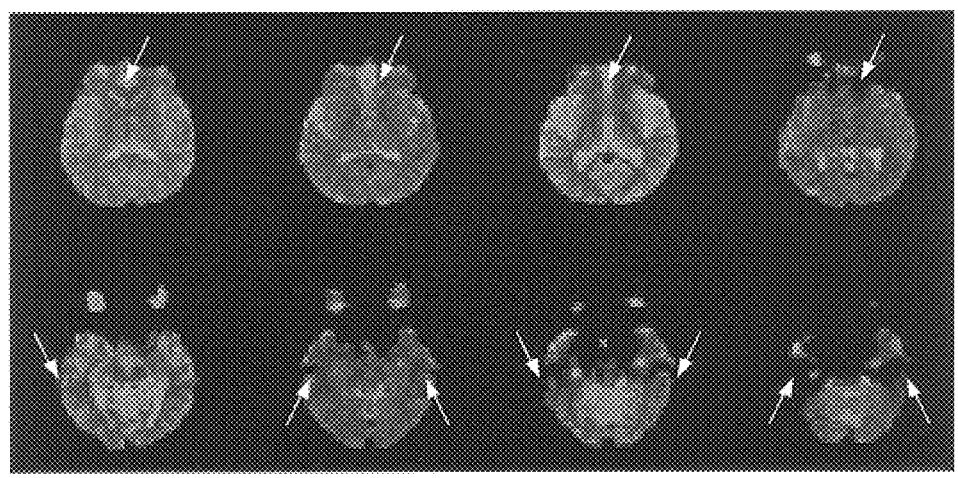
Figure 5C:
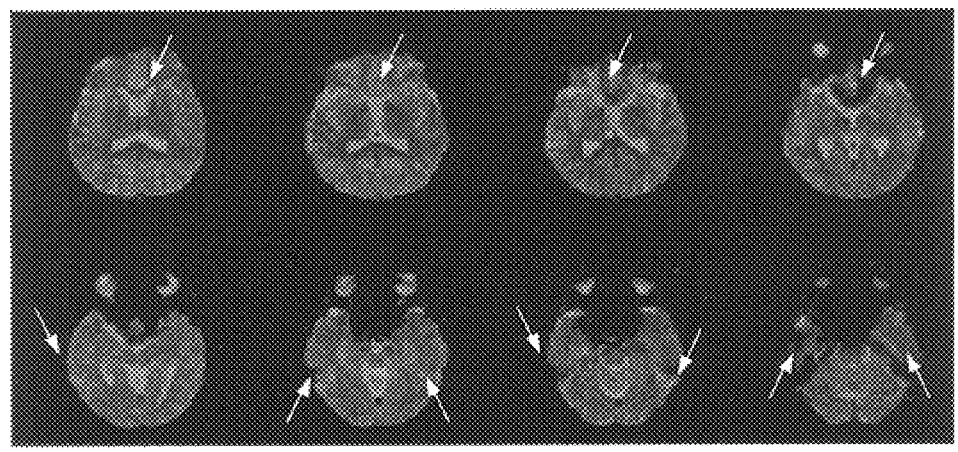

Experiments were carried out on a GE 1.5 T whole-body MRI scanner. The raw data was acquired and transferred to a Silicon Graphics SGI O2 workstation (Mountain View, Calif.) for reconstruction off-line. It was first split into two parts from the joint of the two $k_z$ frames. The two partial $k_z$ frames were then squared by conjugate mirroring to reduce the discontinuity in the point-spread function. Through a realignment and phase correction procedure via the center reference lines, images were reconstructed by a conventional fast Fourier Transform. With z-shim gradient turned off, axial images of a water phantom from these two partial k-space acquisitions were obtained at a TR of 1 s and TE's of 36 ms and 44 ms. FIGS. 4A and 4B show all eight slices with slice thickness of 5 mm from these two acquisitions. The signal-to-noise ration (SNR) of the second acquisition was 12% less than that of the first acquisition, caused by the T2* decay. The second acquisition also showed slightly more distortion caused by the propagation of the accumulative phase errors. The resultant two images can then be summed to a final image by a simple magnitude addition. To assess the feasibility of the in vivo application of this technique, images were also acquired in human subjects. Eight slices of axial images were acquired at the same TR of 1 s and TEs of 36 ms and 44 ms. The slice thickness was 5 mm. After a calibration run where a collection of ten z-shim gradients (thus, the shapes of the quadratic profile) were used, an optimal z-shim gradient was determined at 0.15 G/cm. This procedure takes a period of ten TRs and only consumes short amount of time. At the optimal gradient amplitude, combined images of the two acquisitions are shown in FIG. 5C. To serve as comparisons, images from the same locations using a conventional single-shot gradient-recalled EPI method at a TE of 40 ms are shown in FIG. 5A, and combined images using a two-shot gradient-recalled EPI method at a TE of 40 ms and with the same z-shim gradient are shown in FIG. 5B. The average SNR of FIG. 5B and FIG. 5C are highly comparable at 103 and 101 respectively; however, both are higher than that of 92 in FIG. 5A. The reasons that the partial k-space acquisitions did not suffer much SNR may be mainly the result of completely sampled center portions of the two partial k-space, and also the slightly shorter TE for the first partial k-space acquisition. Several areas at the ventral brain region are shown to have recovered signals (indicated by the arrows in FIGS. 5A through 5C). It can be seen that relatively uniform images are acquired without sacrificing temporal resolution.

The present invention finds use for both pre-clinical animal studies, veterinary and medical applications. The present invention may be advantageously employed for diagnostic evaluation and/or treatment of subjects, in particular human subjects. "Subjects" according to the present invention can be any animal subject, and are preferably mammalian subjects (e.g., humans, canines, felines, bovines, caprines, ovines, equines, rodents, porcines, and/or lagomorphs), and more preferably are human subjects.

The present invention may further be employed for: assessment of cerebral perfusion in following induced subarachnoid hemorrhage or in conditions marked by brain dysfunction, e.g., in connection with acute severe symptomatic hyponatremia; evaluation of new therapies, e.g., in the treatment of cerebral vasospasm (including but not limited to, anti-thrombolytic therapies, calcium channel blockers, anti-inflammatory therapies, angioplasty, and the like); assessment of the presence or absence and/or severity of ischemia in large tissue masses; assessment of the relationship between blood metabolites and cerebral perfusion in cerebral ischemia associated with acute liver failure, e.g., for the treatment of Alzheimer's disease; evaluation of new therapies for stroke, including but not limited to, t-PA, aspirin antiphospholipids, lupus anticoagulants, antiphospholipid antibodies, and the like; evaluation of risk factors for stroke, e.g., serum lipid levels; evaluation of induced brain hypothermia on cerebral perfusion during neurosurgery, e.g., for stroke; evaluation of the effects of age on cerebral perfusion, e.g., to study lacunar infarcts; and assessment of narcotics, e.g., cocaine, amphetamines, ethanol, and the like, on the ischemic brain.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims.

That which is claimed is:

1. A method of recovering a signal of a functional magnetic resonance imaging system, comprising:
    exciting a target region of a subject with a single excitation pulse; then
    obtaining a first image using a first partial k-space frame of the target region; then
    subjecting the target region to a compensation pulse; then
    obtaining a second, compensated, image using a second partial k-space frame of the target region; and
    combining the first and second images to form a combined image of the target region.

2. The method of claim 1, wherein the single excitation pulse comprises a matched quadratic excitation pulse.

3. The method of claim 2, wherein the compensation pulse comprises a z-shimming pulse.

4. The method of claim 1, wherein the first partial k-space frame has associated therewith a first sampling direction and the second partial k-space frame has associated therewith a second sampling direction and wherein the first sampling direction and the second sampling direction are substantially the same direction.

5. The method of claim 1, wherein the first partial k-space frame and the second partial k-space frame are sampled so that a center of each partial k-space frame are proximate each other.

6. The method of claim 1, wherein the step of obtaining a first image comprises the steps of:
    completely sampling a first half of the first partial k-space frame; and
    partially sampling a second half of the first partial k-space frame; and
    wherein the step of obtaining a second image comprises the steps of:
        partially sampling a first half of the second k-space frame; and
        completely sampling a second half of the second k-space frame.

7. The method of claim 6, wherein sampling of the first half and the second half of the first k-space frame and sampling of the first half and the second half of the second k-space frame are carried out following substantially the same direction.

8. The method of claim 1, wherein a TE associated with the first partial k-space frame and a TE associated with the second partial k-space frame are asymmetric with reference to the beginning of the respective k-space frames and are mirrored about a division between the first and second partial k-space frames.

9. The method of claim 1, further comprising the step of inserting alignment indicia in the first and second images, and wherein the combining step comprises the step of aligning the indicia in each of the first and second images.

10. The method of claim 9, wherein the alignment indicia comprise a centerline of the first k-space frame and a centerline of the second k-space frame.

11. The method of claim 1, further comprising the steps of:
    sampling a centerline of the first partial k-space frame in two sampling directions, wherein the centerline comprises the center of a full k-space frame corresponding to the first partial k-space frame; and
    sampling a centerline of the second partial k-space frame in two sampling directions, wherein the centerline comprises the center of a full k-space frame corresponding to the second partial k-space frame.

12. The method of claim 1, wherein the target region of a subject is an in vivo ventral frontal or inferior temporal area of the human brain.

13. The method of claim 1, wherein said combined image provides information about the function of the human brain including human memory and attention processes in areas near air/tissue interfaces.

14. A system for recovering a signal of a functional magnetic resonance imaging system, comprising:
    means for exciting a target region of a subject with a single excitation pulse;
    means for obtaining a first image using a first partial k-space frame of the target region;
    means for subjecting the target region to a compensation pulse responsive to the means for obtaining a first image;
    means for obtaining a second, compensated, image using a second partial k-space frame of the target region responsive to the means for subjecting the target region to a compensation pulse; and
    means for combining the first and second images to form a combined image of the target region.

15. The system of claim 14, wherein the single excitation pulse comprises a matched quadratic excitation pulse.

16. The system of claim 15, wherein the compensation pulse comprises a z-shimming pulse.

17. The system of claim 14, wherein the first partial k-space frame has associated therewith a first sampling direction and the second partial k-space frame has associated therewith a second sampling direction and wherein the first sampling direction and the second sampling direction are substantially the same direction.

18. The system of claim 14, wherein the first partial k-space frame and the second partial k-space frame are sampled so that a center of each partial k-space frame is proximate to each other.

19. The method of claim 14, wherein the means for obtaining a first image comprises:
   means for completely sampling a first half of the first partial k-space frame; and
   means for partially sampling a second half of the first partial k-space frame; and
   wherein the means for obtaining a second image comprises:
      means for partially sampling a first half of the second k-space frame; and
      means for completely sampling a second half of the second k-space frame.

20. The system of claim 19, wherein sampling of the first half and the second half of the first k-space frame and sampling of the first half and the second half of the second k-space frame are carried following substantially the same direction.

21. The system of claim 14, wherein a TE associated with the first partial k-space frame and a TE associated with the second partial k-space frame are asymmetric with reference to the beginning of the respective k-space frames and are mirrored about a division between the first and second partial k-space frames.

22. The system of claim 14, further comprising means for inserting alignment indicia in the first and second images, and wherein the means for combining comprises means for aligning the indicia in each of the first and second images.

23. The system of claim 22, wherein the alignment indicia comprise a centerline of the first k-space frame and a centerline of the second k-space frame.

24. The system of claim 14, further comprising:
   means for sampling a centerline of the first partial k-space frame in two sampling directions, wherein the centerline comprises the center of a full k-space frame corresponding to the first partial k-space frame; and
   means for sampling a centerline of the second partial k-space frame in two sampling directions, wherein the centerline comprises the center of a full k-space frame corresponding to the second partial k-space frame.

25. The system of claim 14, wherein the target region of a subject is an in vivo ventral frontal or inferior temporal area of the human brain.

26. The system of claim 14, wherein the combined image provides information about the function of the human brain including human memory and attention processes in areas near air/tissue interfaces.

27. A computer program product for recovering a signal of a functional magnetic resonance imaging system, comprising:
   a computer readable storage medium having computer readable program code embodied therein, the computer readable program code comprising:
      computer readable program code configured to excite a target region of a subject with a single excitation pulse;
      computer readable program code configured to obtain a first image using a first partial k-space frame of the target region;
      computer readable program code configured to subject the target region to a compensation pulse responsive to the computer readable program code configured to obtain a first image;
      computer readable program code configured to obtain a second, compensated, image using a second partial k-space frame of the target region responsive to the computer readable program code configured to subject the target region to a compensation pulse; and
      computer readable program code configured to combine the first and second images to form a combined image of the target region.

28. The computer program product of claim 27, wherein the single excitation pulse comprises a matched quadratic excitation pulse.

29. The computer program product of claim 28, wherein the compensation pulse comprises a z-shimming pulse.

30. The computer program product of claim 27, wherein the first partial k-space frame has associated therewith a first sampling direction and the second partial k-space frame has associated therewith a second sampling direction and wherein the first sampling direction and the second sampling direction are substantially the same direction.

31. The computer program product of claim 27, wherein the first partial k-space frame and the second partial k-space frame are sampled so that a center of each partial k-space frame is proximate each other.

32. The computer program product of claim 27, wherein the means for obtaining a first image comprises:
   computer readable program code configured to completely sample a first half of the first partial k-space frame; and
   computer readable program code configured to partially sample a second half of the first partial k-space frame; and
   wherein the means for obtaining a second image comprises:
      computer readable program code configured to partially sample a first half of the second k-space frame; and
      computer readable program code configured to completely sample a second half of the second k-space frame.

33. The computer program product of claim 32, wherein sampling of the first half and the second half of the first k-space frame and sampling of the first half and the second half of the second k-space frame are carried out in substantially a same direction.

34. The computer program product of claim 27, wherein a TE associated with the first partial k-space frame and a TE associated with the second partial k-space frame are asymmetric with reference to the beginning of the respective k-space frames and are mirrored about a division between the first and second partial k-space frames.

35. The computer program product of claim 27, further comprising computer readable program code which inserts alignment indicia in the first and second images, and wherein the computer readable program code configured to combine comprises computer readable program code configured to align the indicia in each of the first and second images.

36. The computer program product of claim 35, wherein the alignment indicia comprise a centerline of the first k-space frame and a centerline of the second k-space frame.

37. The computer program product of claim 27, further comprising:

computer readable program code configured to sample a centerline of the first partial k-space frame in two sampling directions, wherein the centerline comprises the center of a full k-space frame corresponding to the first partial k-space frame; and computer readable program code configured to sample a centerline of the second partial k-space frame in two sampling directions, wherein the centerline comprises the center of a full k-space frame corresponding to the second partial k-space frame.

38. The computer program product of claim 27, wherein the target region of a subject is an in vivo ventral frontal or inferior temporal area of the human brain.

39. The computer program product of claim 27, wherein the combined image provides information about the function of the human brain including human memory and attention processes in areas near air/tissue interfaces.

* * * * *